(12) United States Patent
Kondo

(10) Patent No.: US 10,763,642 B2
(45) Date of Patent: Sep. 1, 2020

(54) DRIVER CIRCUIT AND PROCESSING DEVICE

(71) Applicant: NICHIA CORPORATION, Anan-shi, Tokushima (JP)

(72) Inventor: Hideki Kondo, Yokohama (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/395,668

(22) Filed: Apr. 26, 2019

(65) Prior Publication Data

US 2019/0334316 A1    Oct. 31, 2019

(30) Foreign Application Priority Data

Apr. 27, 2018  (JP) ................................ 2018-086238

(51) Int. Cl.

| | |
|---|---|
| *H01S 3/00* | (2006.01) |
| *H01S 5/068* | (2006.01) |
| *H01S 5/026* | (2006.01) |
| *H01S 5/062* | (2006.01) |
| *H01S 5/022* | (2006.01) |

(52) U.S. Cl.
CPC ........ *H01S 5/06808* (2013.01); *H01S 5/0261* (2013.01); *H01S 5/068* (2013.01); *H01S 5/06223* (2013.01); *H01S 5/06804* (2013.01); *H01S 5/06825* (2013.01); *H01S 5/02248* (2013.01)

(58) Field of Classification Search
CPC ............. H01S 5/06808; H01S 5/06804; H01S 5/06825; H01S 5/068; H01S 5/0261; H01S 5/02248; H01S 5/06223
See application file for complete search history.

(56) References Cited

U.S. PATENT DOCUMENTS

| | | | | |
|---|---|---|---|---|
| 4,872,080 A | * | 10/1989 | Hentschel | ........... H01S 5/06825 361/57 |
| 2004/0202216 A1 | * | 10/2004 | Fairgrieve | ........... H01S 5/06808 372/38.07 |
| 2006/0153259 A1 | | 7/2006 | Kimura et al. | |
| 2006/0256050 A1 | * | 11/2006 | Ikeda | ...................... H05B 45/46 345/82 |
| 2009/0190620 A1 | * | 7/2009 | Shou | .................... G11B 7/1263 372/38.02 |

(Continued)

FOREIGN PATENT DOCUMENTS

| | | |
|---|---|---|
| JP | 2005-085871 | 3/2005 |
| JP | 2006-185997 | 7/2006 |

(Continued)

*Primary Examiner* — Kinam Park
(74) *Attorney, Agent, or Firm* — Foley & Lardner LLP

(57) ABSTRACT

A driver circuit includes: a variable power supply configured to apply a power supply voltage to a light emitting device and to vary a voltage value of the power supply voltage; a current-control switching device electrically connected to the light emitting device and configured to control a current flowing in the light emitting device; a detection part configured to detect a current value and a voltage value related to the current flowing in the light emitting device; and a control part configured to determine a minimum voltage of the power supply voltage based on a detection result of the detection part.

6 Claims, 3 Drawing Sheets

(56) References Cited

U.S. PATENT DOCUMENTS

| | | | |
|---|---|---|---|
| 2009/0201701 A1* | 8/2009 | Cuadra | H02M 3/33523 363/21.15 |
| 2010/0142336 A1* | 6/2010 | Ishibashi | G11B 7/1263 369/47.5 |
| 2015/0130903 A1* | 5/2015 | Thompson | H01S 5/042 348/46 |
| 2019/0068288 A1* | 2/2019 | Saad | G02F 1/0123 |

FOREIGN PATENT DOCUMENTS

| | | |
|---|---|---|
| JP | 2010-015887 A | 1/2010 |
| WO | WO-2006/137303 A1 | 12/2006 |

\* cited by examiner

DRIVER CIRCUIT AND PROCESSING DEVICE

CROSS-REFERENCE TO RELATED APPLICATIONS

This application is based upon and claims priority to Japanese Patent Application No. 2018-086238, filed on Apr. 27, 2018, the entire contents of which are incorporated herein by reference.

FIELD

Embodiments described herein generally relate to a drive circuit and a processing device.

BACKGROUND

There is known a processing device for processing an object by light radiated from a light emitting device. Examples of such a processing device include a laser exposure device for performing light exposure of a resist with laser light, and a laser machining device for machining, for example, cutting, an object with laser light.

The processing device includes a light emitting device and a driver circuit for driving the light emitting device. The driver circuit includes a switching device for current-control electrically connected to the light emitting device. The current flowing in the light emitting device is controlled by the switching device for current-control to control the intensity of light radiated from the light emitting device.

In such a driver circuit and a processing device, heat generation in the switching device for current-control causes a decrease of the lifetime of the switching device for current-control. In this regard, for instance, a cooling mechanism may be used to cool the switching device for current-control. However, providing a large-capacity cooling mechanism causes an increase in the size of the driver circuit and an increase in manufacturing cost. Thus, in the driver circuit and the processing device, it is desired to reduce the heat generation in the switching device for current-control with a simple configuration.

SUMMARY

According to one embodiment, a driver circuit includes a variable power supply, a current-control switching device, a detection part, and a control part. The variable power supply is configured to apply a power supply voltage to a light emitting device and to vary a voltage value of the power supply voltage. The current-control switching device is electrically connected to the light emitting device and is configured to control a current flowing in the light emitting device. The detection part is configured to detect a current value and a voltage value related to the current flowing in the light emitting device. The control part is configured to determine a minimum voltage of the power supply voltage based on a detection result of the detection part.

DETAILED DESCRIPTION

Figure 1:
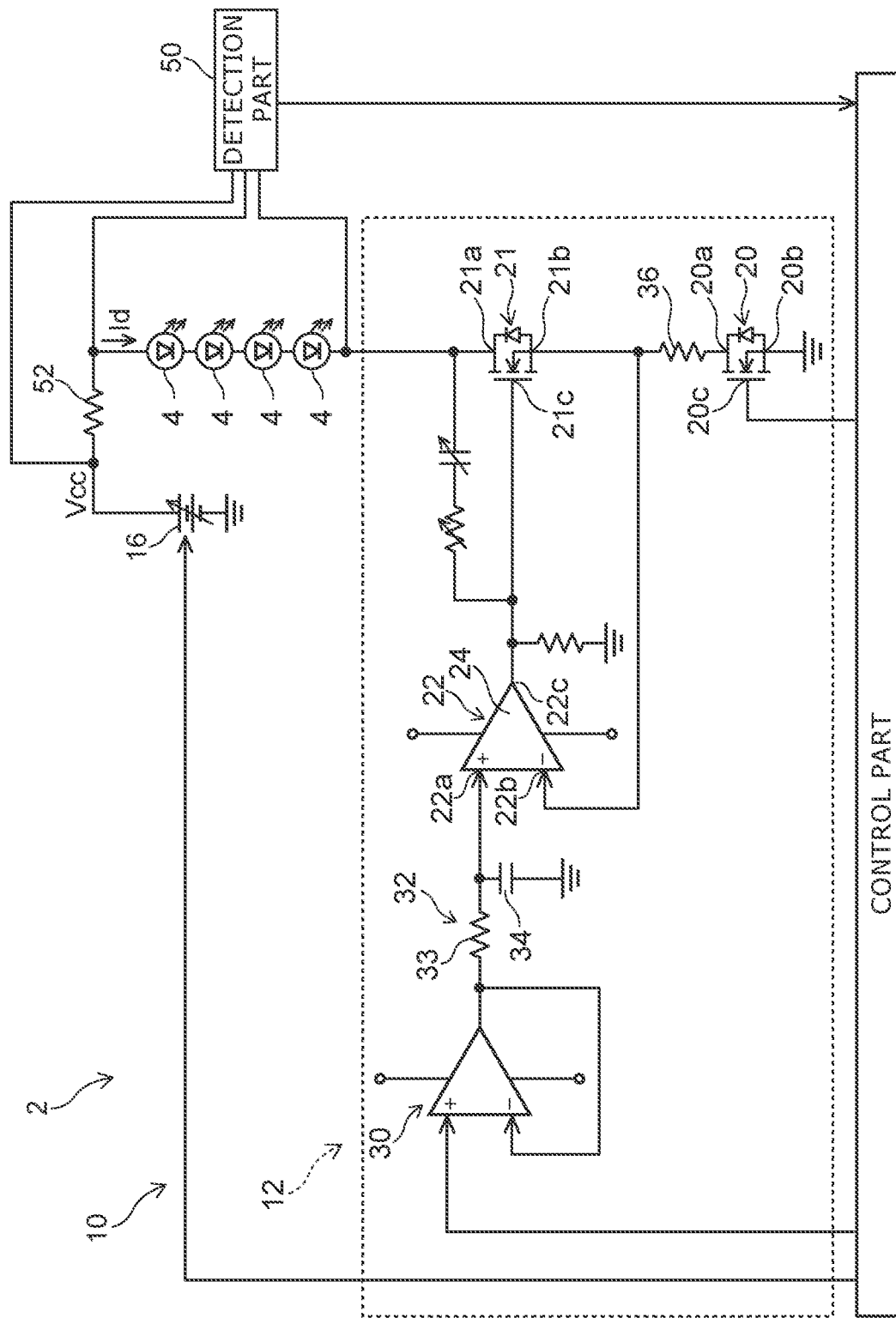
FIG. 1 is a block diagram schematically showing a driver circuit and a processing device according to an embodiment.

According to one embodiment, a driver circuit includes a variable power supply, a current-control switching device, a detection part, and a control part. The variable power supply is configured to apply a power supply voltage to a light emitting device and to vary a voltage value of the power supply voltage. The current-control switching device is electrically connected to the light emitting device and is configured to control a current flowing in the light emitting device. The detection part is configured to detect a current value and a voltage value related to the current flowing in the light emitting device. The control part is configured to determine a minimum voltage of the power supply voltage based on a detection result of the detection part.

Embodiments will now be described with reference to the drawings. In the drawings, the same devices are marked with the same reference numerals.

FIG. 1 is a block diagram schematically showing a driver circuit and a processing device according to an embodiment.

As shown in FIG. 1, the processing device 2 includes a light emitting device 4 and a driver circuit 10. The processing device 2 includes, for example, a plurality of light emitting devices 4 connected in series. For convenience, FIG. 1 shows four light emitting devices 4 connected in series. The number of light emitting devices 4 is not limited to four, but may be any arbitrary number. The number of light emitting devices 4 may be one. The light emitting device 4 is, for example, a laser diode. However, the light emitting device 4 is not limited to a laser diode, but may be other light emitting devices such as a light emitting diode.

The light emitting device 4 is electrically connected to the driver circuit 10. The term "electrically connected" may refer to the state in which two members are directly connected through, for example, an interconnect, or the state in which two members are indirectly connected through, for example, another conductive member.

The driver circuit 10 drives the light emitting device 4. The driver circuit 10 performs switching between radiation of light and its stoppage from the light emitting device 4, and adjusts the intensity of light radiated from the light emitting device 4. Thus, the processing device 2 performs a prescribed processing on an object by driving the light emitting device 4 with the driver circuit 10 and radiating light of a prescribed pattern from the light emitting device 4 through an optical system.

More specifically, the processing device 2 is, for example, a light exposure device or a machining device. In the case of a light exposure device, the object to be processed by the processing device 2 is, for example, a semiconductor wafer. The processing device 2 performs light exposure of a prescribed pattern on a resist applied onto the wafer surface with light radiated from the light emitting device 4 through an optical system. In the case of a machining device, the object to be processed by the processing device 2 is, for example, a metal plate. The processing device 2 performs various machining such as cutting and boring on the object with light radiated from the light emitting device 4 through an optical system.

The driver circuit 10 includes a main circuit 12, a control part 14, and a variable power supply 16. The variable power supply 16 is electrically connected to the light emitting device 4. The variable power supply 16 applies a DC power supply voltage Vcc to the light emitting device 4. The variable power supply 16 is configured to vary the voltage value of the power supply voltage Vcc applied to the light emitting device 4. The light emitting device 4 radiates light in response to the power supply voltage Vcc supplied from the variable power supply 16.

The driver circuit 10 drives the light emitting device 4. In other words, the driver circuit 10 drives supply of the power supply voltage Vcc from the variable power supply 16 to the light emitting device 4. The control part 14 controls the operation of the main circuit 12. The main circuit 12 drives the light emitting device 4 based on the control of the control part 14. The control part 14 is electrically connected to the variable power supply 16. The control part 14 controls the voltage value of the power supply voltage Vcc of the variable power supply 16. The variable power supply 16 varies the voltage value of the power supply voltage Vcc based on the control of the control part 14.

The main circuit 12 includes a switching device 20, a current-control switching device 21, and a differential amplifier circuit 22. The current-control switching device 21 is electrically connected to the light emitting device 4 and controls the current Id flowing in the light emitting device 4.

The current-control switching device 21 is, for example, series-connected to the light emitting device 4. The light emitting device 4 is provided between the variable power supply 16 and the current-control switching device 21. For instance, the light emitting device 4 is a laser diode. In this case, the anode of one of the light emitting devices 4 is electrically connected to the variable power supply 16. The cathode of one of the light emitting devices 4 is electrically connected to the current-control switching device 21.

The switching device 20 is series-connected to the current-control switching device 21. The switching device 20 is provided, for example, between the current-control switching device 21 and the ground (common potential). Thus, a current Id flows in the light emitting device 4 by turning on the switching devices 20, 21. This causes light to be radiated from the light emitting device 4. On the other hand, supply of the current Id to the light emitting device 4 is stopped by turning off at least one of the switching devices 20, 21. This stops radiation of light from the light emitting device 4.

The switching devices 20, 21 are made of, for example, a bipolar transistor or FET. However, the switching devices 20, 21 are not limited thereto, but may be an arbitrary switching device configured to switch between supply and stoppage of the current Id to the light emitting device 4.

The current-control switching device 21 includes a first main terminal 21a, a second main terminal 21b, and a control terminal 21c. The first main terminal 21a is electrically connected to the light emitting device 4. The control terminal 21c controls the current flowing between the first main terminal 21a and the second main terminal 21b. For instance, the current-control switching device 21 may be an FET. In this case, the first main terminal 21a is a drain, the second main terminal 21b is a source, and the control terminal 21c is a gate. Likewise, the switching device 20 includes a first main terminal 20a, a second main terminal 20b, and a control terminal 20c.

The current-control switching device 21 adjusts the magnitude of the current flowing between the first main terminal 21a and the second main terminal 21b in response to the voltage applied to the control terminal 21c. That is, the main circuit 12 adjusts the magnitude of the current Id flowing in the light emitting device 4 by adjusting the voltage of the control terminal 21c of the current-control switching device 21. In other words, the main circuit 12 adjusts the intensity of light radiated from the light emitting device 4 by adjusting the voltage of the control terminal 21c of the current-control switching device 21. The main circuit 12 adjusts the voltage of the control terminal 21c so that, for example, a substantially constant current Id flows in the light emitting device 4. The main circuit 12 is, for example, a constant current circuit.

The differential amplifier circuit 22 includes a first input terminal 22a, a second input terminal 22b, and an output terminal 22c. The output terminal 22c is electrically connected to the control terminal 21c of the current-control switching device 21. Input to the first input terminal 22a is a reference signal as a reference for radiating light of a desired intensity from the light emitting device 4. Input to the second input terminal 22b is a detection signal corresponding to the detection result of the current Id flowing in the light emitting device 4. In other words, the detection signal is a feedback signal for feeding back the detection result of the current Id flowing in the light emitting device 4 to the differential amplifier circuit 22. A resistor and a capacitor may be placed between the output terminal 22c and the first main terminal 21a of the current-control switching device 21.

The differential amplifier circuit 22 controls the current flowing in the light emitting device 4 and the current-control switching device 21 based on the voltage of the first input terminal 22a and the voltage of the second input terminal 22b. The differential amplifier circuit 22 applies a voltage in accordance with the difference between the reference signal and the detection signal to the control terminal 21c of the current-control switching device 21. Thus, the differential amplifier circuit 22 causes a substantially constant current corresponding to the reference signal to flow in the light emitting device 4.

The detection signal is set so as to have, for example, the same value as the reference signal when a desired current Id corresponding to the reference signal flows in the light emitting device 4. The differential amplifier circuit 22 causes a substantially constant current Id to flow in the light emitting device 4 by applying a voltage from the output terminal 22c to the control terminal 21c.

When the current Id flowing in the light emitting device 4 is larger than the desired current corresponding to the reference signal, the detection signal becomes larger, and its difference from the reference signal becomes smaller than a prescribed amount. Thus, the voltage applied to the control terminal 21c becomes smaller. Accordingly, the current Id flowing in the light emitting device 4 is controlled to decrease. Conversely, when the current Id flowing in the light emitting device 4 is smaller than the desired current corresponding to the reference signal, the detection signal becomes smaller, and its difference from the reference signal becomes larger than a prescribed amount. Thus, the voltage applied to the control terminal 21c becomes larger. Accordingly, the current Id flowing in the light emitting device 4 is controlled to increase. Thus, the current Id flowing in the light emitting device 4 can be made closer to the value corresponding to the reference signal and controlled to be a substantially constant current.

The differential amplifier circuit 22 includes, for example, an operational amplifier 24. The first input terminal 22a is, for example, a non-inverting input terminal of the operational amplifier 24. The second input terminal 22b is, for example, an inverting input terminal of the operational amplifier 24. The differential amplifier circuit 22 is not limited to a configuration including an operational amplifier 24, but may be configured to have the same function by combining, for example, a plurality of transistors.

The first input terminal 22a is electrically connected to the control part 14. The reference signal is input from the control part 14. The control part 14 inputs the reference signal to the first input terminal 22a so that light of an appropriate intensity is radiated from the light emitting device 4 in accordance with, for example, the kind of the object or the kind of processing performed on the object. The control part 14 can decrease the voltage applied to the control terminal 21c by decreasing the reference signal (e.g. to 0 V). Thus, the control part 14 can turn off the current-control switching device 21. That is, the control part 14 can maintain the light emitting device 4 in the extinguished state.

The main circuit 12 includes, for example, a voltage follower 30 and a low-pass filter 32. The voltage follower 30 is provided between the control part 14 and the first input terminal 22a. The voltage follower 30 functions as, for example, a buffer for suppressing variation of the signal outputted from the control part 14. The voltage follower 30 is composed of, for example, an operational amplifier in which the output terminal and the inverting input terminal are short-circuited.

The low-pass filter 32 is provided between the voltage follower 30 and the first input terminal 22a. The low-pass filter 32 includes, for example, a resistor element 33 and a capacitor 34. The resistor element 33 is connected between the voltage follower 30 and the first input terminal 22a. The capacitor 34 is connected between the ground (common potential) and the signal line connecting the first input terminal 22a and the resistor element 33. The low-pass filter 32 reduces, for example, high-frequency components contained in the signal outputted from the control part 14 (voltage follower 30).

The voltage follower 30 and the low-pass filter 32 thus provided enables a more appropriate reference signal to be input to the first input terminal 22a. The voltage follower 30 and the low-pass filter 32 are provided as necessary, and can be omitted.

The main circuit 12 includes a resistor element 36. One end of the resistor element 36 is electrically connected to the second main terminal 21b of the current-control switching device 21. The other end of the resistor element 36 is electrically connected to the first main terminal 20a of the switching device 20. Thus, a voltage corresponding to the current Id flowing in the light emitting device 4 is generated across the resistor element 36 and the switching device 20. In other words, the resistor element 36 is a resistor for detecting the current Id flowing in the light emitting device 4.

One end of the resistor element 36 is electrically connected to the second input terminal 22b and the second main terminal 21b of the current-control switching device 21. Thus, the voltage generated across the resistor element 36 and the switching device 20 is input to the second input terminal 22b as a detection signal. However, the method for inputting the detection signal to the second input terminal 22b is not limited thereto, but may be arbitrary.

The second main terminal 20b of the switching device 20 is electrically connected to the ground (common potential). The control terminal 20c of the switching device 20 is electrically connected to the control part 14. The control part 14 inputs a pulse signal periodically repeating on/off to the control terminal 20c of the switching device 20.

When the pulse signal is on (high), the voltage value of the pulse signal is sufficiently higher than the threshold voltage value of the switching device 20. Thus, when the pulse signal is on, the current Id flowing in the light emitting device 4 is controlled based on the reference signal and the detection signal as described above.

On the other hand, when the pulse signal is off (low), the voltage value of the pulse signal is lower than the threshold voltage value of the switching device 20. That is, when the pulse signal is off, radiation of light from the light emitting device 4 is stopped.

Thus, the control part 14 inputs a reference signal to the first input terminal 22a of the differential amplifier circuit 22, and inputs a pulse signal to the control terminal 20c of the switching device 20. Accordingly, the control part 14 causes pulse oscillation in the light emitting device 4.

The control part 14 varies the duty cycle of the pulse signal input to the control terminal 20c of the switching device 20 in accordance with, for example, the kind of the object or the kind of processing performed on the object. This facilitates adjusting, for example, energy applied to the object. The oscillation of the light emitting device 4 is not limited to pulse oscillation, but may be continuous oscillation. The switching device 20 and the input of the pulse signal from the control part 14 to the control terminal 20c of the switching device 20 can be omitted in the case of operation only in continuous oscillation.

In this example, the control part 14 is illustrated as a signal source for inputting a pulse signal for causing pulse oscillation in the light emitting device 4 to the control terminal 20c of the switching device 20. The signal source is not limited to the control part 14, but may be an arbitrary signal source configured to input a pulse signal to the control terminal 20c of the switching device 20. For instance, a dedicated oscillation circuit may be used as a signal source.

The driver circuit 10 further includes a detection part 50 for detecting the current value and the voltage value related to the current Id flowing in the light emitting device 4. The detection part 50 is electrically connected, for example, across a plurality of series-connected light emitting devices 4 and between a current-detecting resistor 52 and the variable power supply 16. Thus, the detection part 50 detects the series voltage value and the current value of the light emitting device 4. For instance, the detection part 50 detects the series voltage value of the light emitting device 4, and detects the current value of the current Id flowing in the light emitting device 4.

The detection part 50 is electrically connected to the control part 14. The detection part 50 inputs a detection result to the control part 14. That is, in this example, the detection part 50 inputs the detected series voltage value and current value of the light emitting device 4 to the control part 14. The control part 14 determines the minimum voltage Vmin of the power supply voltage Vcc applied from the variable power supply 16 to the light emitting device 4 based on the detection result of the detection part 50.

Figure 2:
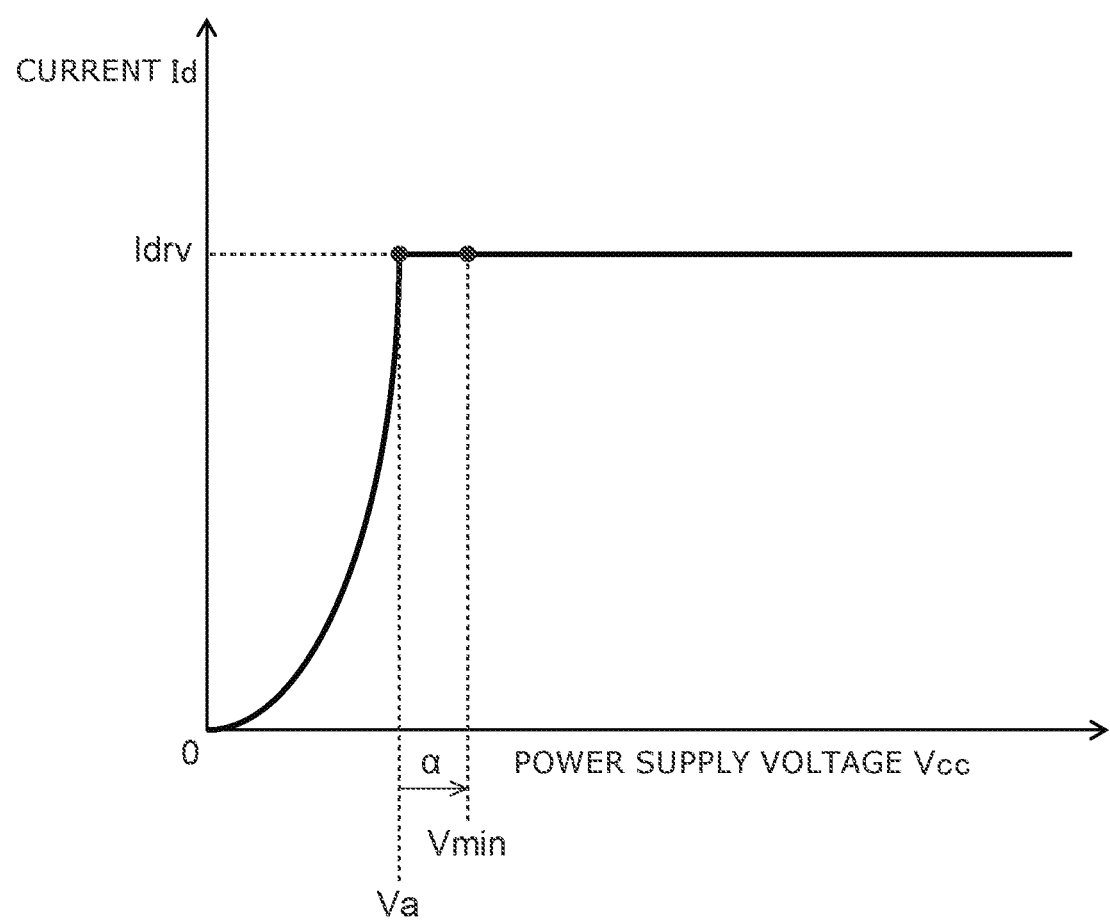
FIG. 2 is a graph schematically showing an example of current-voltage characteristics of the light emitting device and its relation to the power supply voltage of the variable power supply.

FIG. 2 is a graph schematically showing an example of current-voltage characteristics of the light emitting device and its relation to the power supply voltage Vcc of the variable power supply 16.

The horizontal axis of FIG. 2 represents the power supply voltage Vcc of the variable power supply 16. The vertical axis represents the current Id flowing in the light emitting device 4.

When determining the minimum voltage Vmin, the control part 14 sets the voltage value of the power supply voltage Vcc in accordance with the series operation voltage of the light emitting device 4. Furthermore, the control part 14 applies a control voltage for passing a desired driving current Idrv in the light emitting device 4 to the voltage follower 30. Thus, the control part 14 controls the control terminal 21c of the current-control switching device 21. In this case, the control part 14 causes, for example, continuous oscillation in the light emitting device 4.

The series operation voltage is set in accordance with, for example, the forward drop voltage Vf of the light emitting device 4. For instance, the forward drop voltage Vf of the light emitting device 4 is 16 V. In this case, the voltage value of the power supply voltage Vcc is set to 16 V. Thus, a current in accordance with the voltage value of the power supply voltage Vcc and the control voltage set to the control terminal 21c of the current-control switching device 21 starts to flow in the light emitting device 4.

After setting the voltage value of the power supply voltage Vcc and the control voltage, the control part 14 varies the voltage value of the power supply voltage Vcc. For instance, the control part 14 gradually increases the voltage value of the power supply voltage Vcc. As shown in FIG. 2, when the voltage value of the power supply voltage Vcc is increased gradually, the current flowing in the light emitting device 4 is eventually saturated at the driving current Idrv in accordance with the control voltage. That is, a substantially constant driving current Idrv flows in the light emitting device 4.

The control part 14 defines the minimum voltage Vmin as the voltage value of the power supply voltage Vcc at which the current Id flowing in the light emitting device 4 starts to be saturated. For instance, the control part 14 determines that the current Id flowing in the light emitting device 4 is saturated at the driving current Idrv when the current Id flowing in the light emitting device 4 lies within the variation range of ±1% with respect to the desired driving current Idrv. The state in which the current Id flowing in the light emitting device 4 is saturated at the driving current Idrv can be rephrased as the state in which a substantially constant driving current Idrv flows in the light emitting device 4.

The control part 14 defines the voltage value of the power supply voltage Vcc starting to be saturated at the driving current Idrv, that is, the minimum voltage Vmin, as a voltage value higher by a prescribed margin α than the lowest voltage value Va of the power supply voltage Vcc at which the current Id is determined to be saturated as described above. The margin α is set to, for example, approximately 5% (e.g. 5% or more and 10% or less) of the series operation voltage of the light emitting device 4. For instance, in the case where the series operation voltage is 16 V, the margin α is set to approximately 1 V.

For instance, the actual forward drop voltage Vf of the light emitting device 4 may lie near the lower bound of the specification due to manufacturing variations. In this case, a substantially constant driving current Idrv may flow in the light emitting device 4 at the time of setting the voltage value of the power supply voltage Vcc in accordance with the series operation voltage as described above. For instance, when the series operation voltage is set to 16 V, the actual forward drop voltage Vf of the light emitting device 4 may be approximately 15.2 V. In this case, a substantially constant driving current Idrv may flow in the light emitting device 4 at the time of setting the voltage value of the power supply voltage Vcc in accordance with the series operation voltage. In such cases, the control part 14 confirms that a substantially constant current is flowing in the light emitting device 4 by gradually increasing the voltage value of the power supply voltage Vcc. Then, the control part 14 gradually decreases the voltage value of the power supply voltage Vcc. Thus, the minimum voltage Vmin can be determined as in the foregoing also in the case where the actual forward drop voltage Vf of the light emitting device 4 has variations on the lower side.

The control part 14 determines the minimum voltage Vmin of the power supply voltage Vcc as described above. Thus, the minimum voltage Vmin can be determined appropriately also in the case where, for example, there are manufacturing errors in the forward drop voltage Vf of the light emitting device 4.

The control part 14 performs the operation of determining the minimum voltage Vmin before starting to perform processing such as light exposure and machining on the object. Then, the control part 14 sets the determined minimum voltage Vmin to the variable power supply 16, and supplies the power supply voltage Vcc of the minimum voltage Vmin from the variable power supply 16 to the light emitting device 4. Thus, the control part 14 performs processing on the object.

This can suppress electric power supplied to the current-control switching device 21 and reduce the heat generation of the current-control switching device 21 compared with the case of setting a high power supply voltage Vcc. This can also suppress the decrease of lifetime of the current-control switching device 21 by reducing the heat generation of the current-control switching device 21 as described above. Furthermore, power consumption can be decreased by suppressing the power supply voltage Vcc at the minimum voltage Vmin. Furthermore, there is no need to provide, for example, a large-capacity cooling mechanism for the current-control switching device 21. Thus, the driver circuit 10 according to this embodiment can reduce the heat generation of the current-control switching device 21 with a simple configuration.

The minimum voltage Vmin may vary with, for example, a temperature of the light emitting device 4. Thus, the control part 14 may regularly perform the operation of determining the minimum voltage Vmin and update the minimum voltage Vmin after starting to perform processing on the object. Alternatively, the temperature of, for example, the light emitting device 4 or the current-control switching device 21 may be detected. Each time the variation of the temperature of one of them exceeds a prescribed value, the operation of determining the minimum voltage Vmin may be regularly performed to update the minimum voltage Vmin. Thus, the minimum voltage Vmin can be determined more accurately. This can suppress the heat generation of the current-control switching device 21 more reliably.

Figure 3:
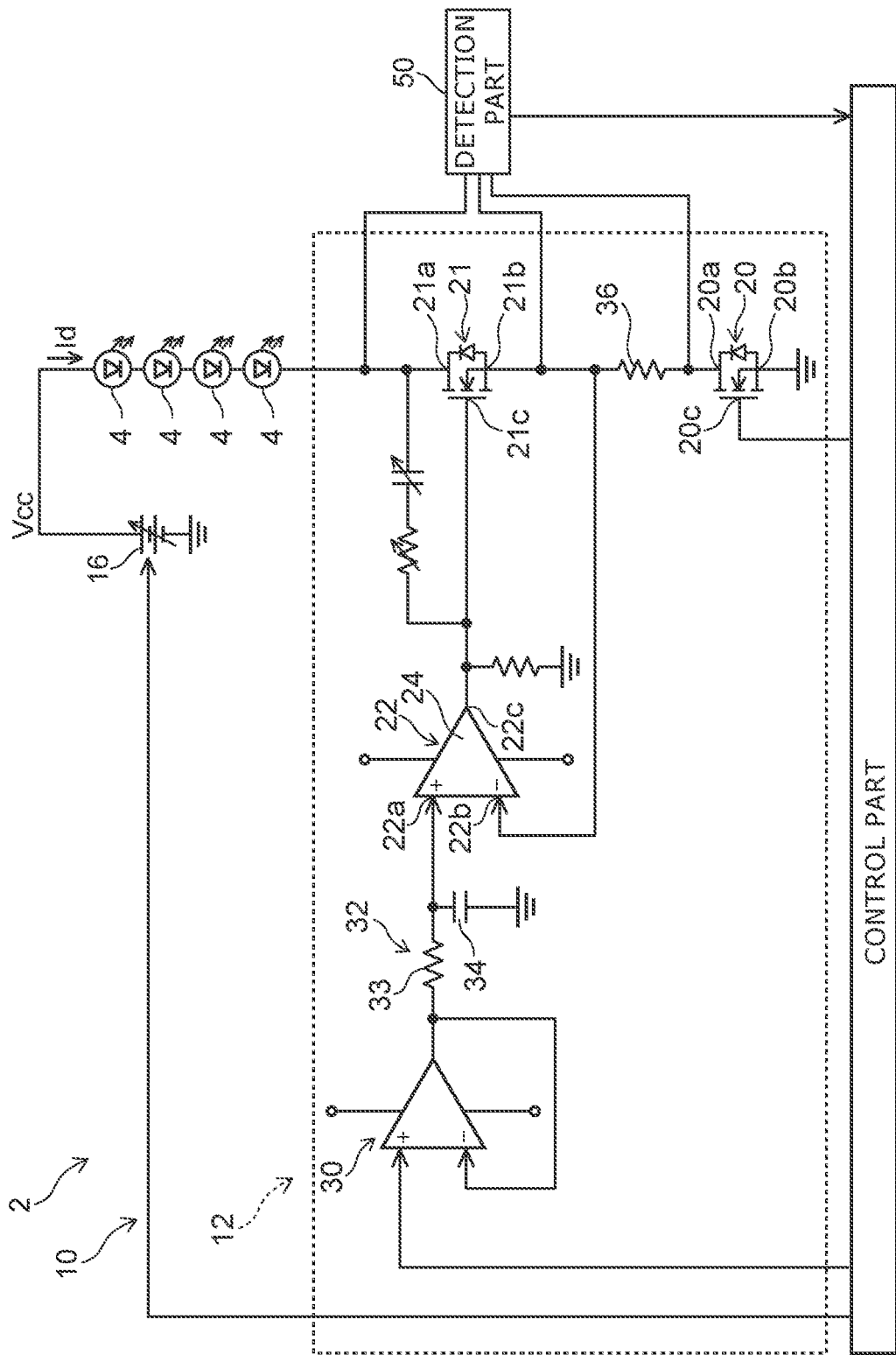
FIG. 3 is a block diagram schematically showing a variation of the driver circuit and the processing device according to the embodiment.

FIG. 3 is a block diagram schematically showing a variation of the driver circuit and the processing device according to the embodiment.

The devices substantially identical in function or configuration to those of the above embodiment are marked with the same reference numerals, and the detailed description thereof is omitted.

As shown in FIG. 3, in this example, the detection part 50 is electrically connected to the first main terminal 21a and the second main terminal 21b of the current-control switching device 21. Thus, the detection part 50 detects the voltage value between the first main terminal 21a and the second main terminal 21b of the current-control switching device 21. The detection part 50 is electrically connected to the signal line between the resistor element 36 and the first main terminal 20a of the switching device 20.

The voltage value between the first main terminal 21a and the second main terminal 21b of the current-control switching device 21 varies with the current Id flowing in the light emitting device 4. Thus, the voltage value related to the current Id flowing in the light emitting device 4 can be detected as in the above embodiment also by detecting the voltage value between the first main terminal 21a and the second main terminal 21b of the current-control switching device 21. In the configuration of FIG. 3, the voltage value of the resistor element 36 electrically connected to the second main terminal 21b of the current-control switching device 21 can also be detected by the potential difference between the second main terminal 21b of the current-control switching device 21 and the first main terminal 20a of the switching device 20. The voltage value of the resistor element 36 varies likewise with the current Id flowing in the light emitting device 4. Thus, the current value and the voltage value related to the current Id flowing in the light emitting device 4 can be detected by detecting the voltage value of the resistor element 36. The minimum voltage Vmin can be determined as in the above embodiment.

Thus, the voltage value and the current value detected by the detection part 50 are not limited to the voltage value of the light emitting device 4 itself, but may be an arbitrary current value and voltage value related to the current Id flowing in the light emitting device 4.

The configuration of the detection part 50 may be an arbitrary configuration configured to detect the current value and the voltage value related to the current Id flowing in the light emitting device 4. The detection part 50 may detect a plurality of voltage values and current values related to the current Id such as the voltage value of the light emitting device 4, the voltage value of the current-control switching device 21, and the voltage value of the resistor element 36.

While certain embodiments have been described, these embodiments have been presented by way of example only, and are not intended to limit the scope of the invention. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A driver circuit comprising:
   a variable power supply configured to apply a power supply voltage to a light emitting device and to vary a voltage value of the power supply voltage;
   a current-control switching device electrically connected to the light emitting device and configured to control a current flowing in the light emitting device;
   a detection part configured to detect a current value and a voltage value related to the current flowing in the light emitting device; and
   a control part configured to determine a minimum voltage of the power supply voltage based on a detection result of the detection part.

2. The circuit according to claim 1, wherein:
   the current-control switching device comprises a first main terminal electrically connected to the light emitting device, a second main terminal, and a control terminal configured to control a current flowing between the first main terminal and the second main terminal, and
   the control part is configured to set a voltage value of the power supply voltage in accordance with an operating voltage of the light emitting device, to set a control voltage for passing a desired driving current in the light emitting device to the control terminal of the current-control switching device, to subsequently vary the voltage value of the power supply voltage, and to define the minimum voltage as the voltage value at which the current flowing in the light emitting device starts to be saturated at the driving current.

3. The circuit according to claim 1, wherein the detection part is configured to detect a voltage value of the light emitting device.

4. The circuit according to claim 1, wherein the detection part is configured to detect a voltage value of the switching device for current-control.

5. The circuit according to claim 1, further comprising:
   a resistor element electrically connected to the switching device for current-control,
   wherein the detection part is configured to detect a voltage value of the resistor element.

6. A processing device comprising:
   a light emitting device; and
   a driver circuit configured to drive the light emitting device and comprising:
     a variable power supply configured to apply a power supply voltage to the light emitting device and to vary a voltage value of the power supply voltage;
     a switching device for current-control electrically connected to the light emitting device and configured to control a current flowing in the light emitting device;
     a detection part configured to detect a current value and a voltage value related to the current flowing in the light emitting device; and
     a control part configured to determine a minimum voltage of the power supply voltage based on a detection result of the detection part.

* * * * *